United States Patent [19]
Dorri et al.

[11] Patent Number: 5,093,645
[45] Date of Patent: Mar. 3, 1992

[54] SUPERCONDUCTIVE SWITCH FOR CONDUCTION COOLED SUPERCONDUCTIVE MAGNET

[75] Inventors: Bizhan Dorri, Clifton Park; Evangelos T. Laskaris, Schenectady, both of N.Y.

[73] Assignee: General Electric Company, Schenectady, N.Y.

[21] Appl. No.: 563,584

[22] Filed: Aug. 6, 1990

[51] Int. Cl.⁵ .......................... H01F 1/00; H01F 7/00; H01F 7/22
[52] U.S. Cl. ...................................... 335/216; 338/325; 174/125.1
[58] Field of Search ................ 335/212, 216; 338/325; 174/125.1

[56] References Cited
U.S. PATENT DOCUMENTS

| | | | |
|---|---|---|---|
| 4,528,532 | 7/1985 | Keim | 335/216 |
| 4,568,908 | 2/1986 | Laskaris et al. | 338/295 |
| 4,803,456 | 2/1989 | Benesch | 338/32 S |
| 4,904,970 | 2/1990 | Srivastava | 335/216 |
| 4,924,198 | 5/1990 | Laskaris | 335/216 |
| 4,924,378 | 7/1990 | Barber | 335/216 |
| 4,926,647 | 5/1990 | Dorri et al. | 62/51.1 |
| 4,943,792 | 7/1990 | Sprivastava et al. | 335/216 |
| 4,963,852 | 10/1990 | Drehman | 335/216 |

*Primary Examiner*—Leo P. Picard
*Assistant Examiner*—Ramon M. Barrera
*Attorney, Agent, or Firm*—James R. McDaniel; James C. Davis, Jr.; Paul R. Webb, II

[57] ABSTRACT

A superconductive switch for a superconductive magnet is bifilarly wound on a bobbin with niobium-tin tape and laminated with stainless steel foil for structural rigidity is provided. The switch is vacuum pressure epoxy impregnated and cooled by copper bus bars which are heat stationed to a cryocooler which is also used to conduction cool the superconductive magnet. The bus bars are also used to introduce a voltage across the switch and the magnet windings which are connected in series with one another to ramp up the current.

20 Claims, 4 Drawing Sheets

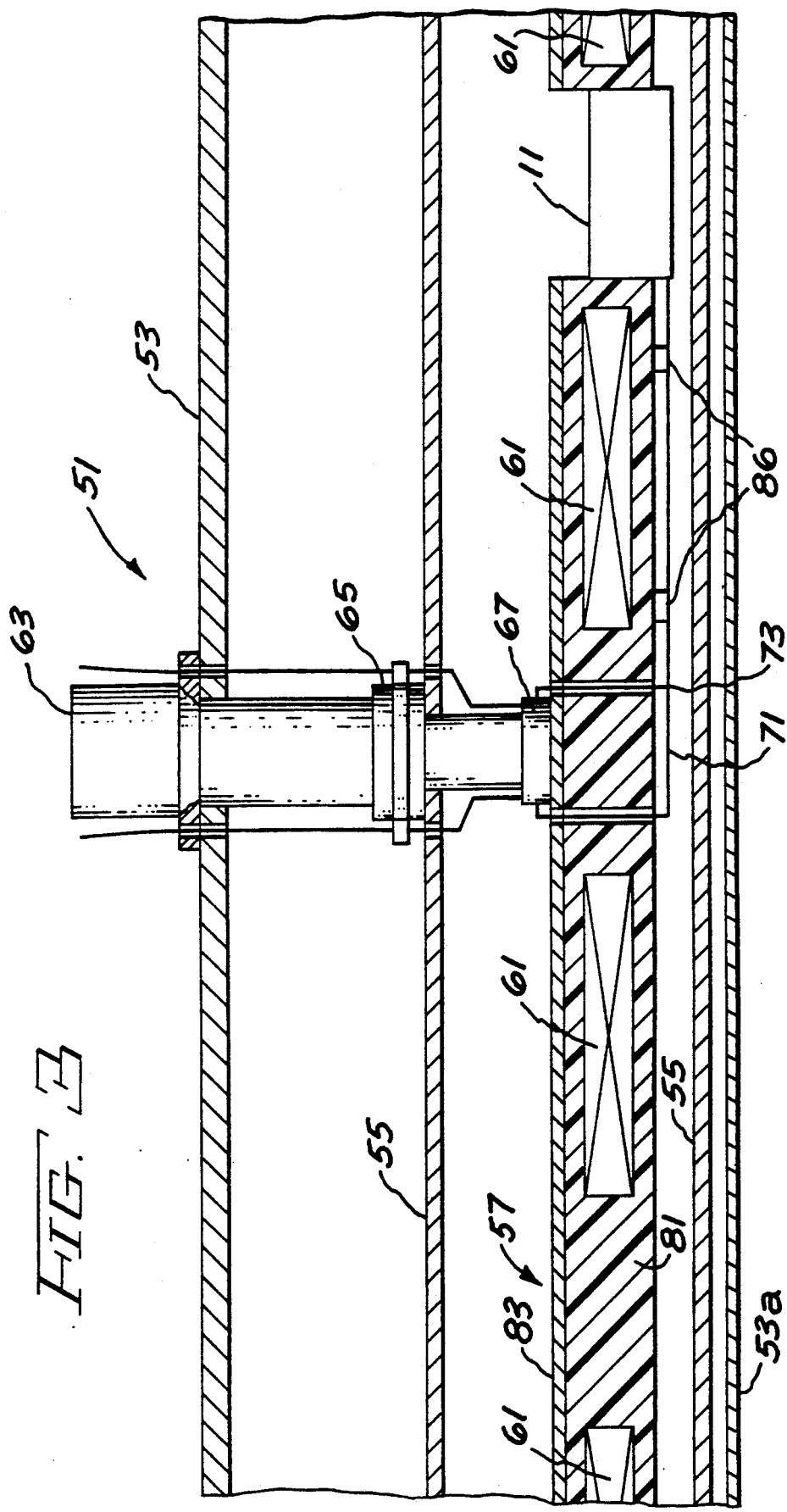

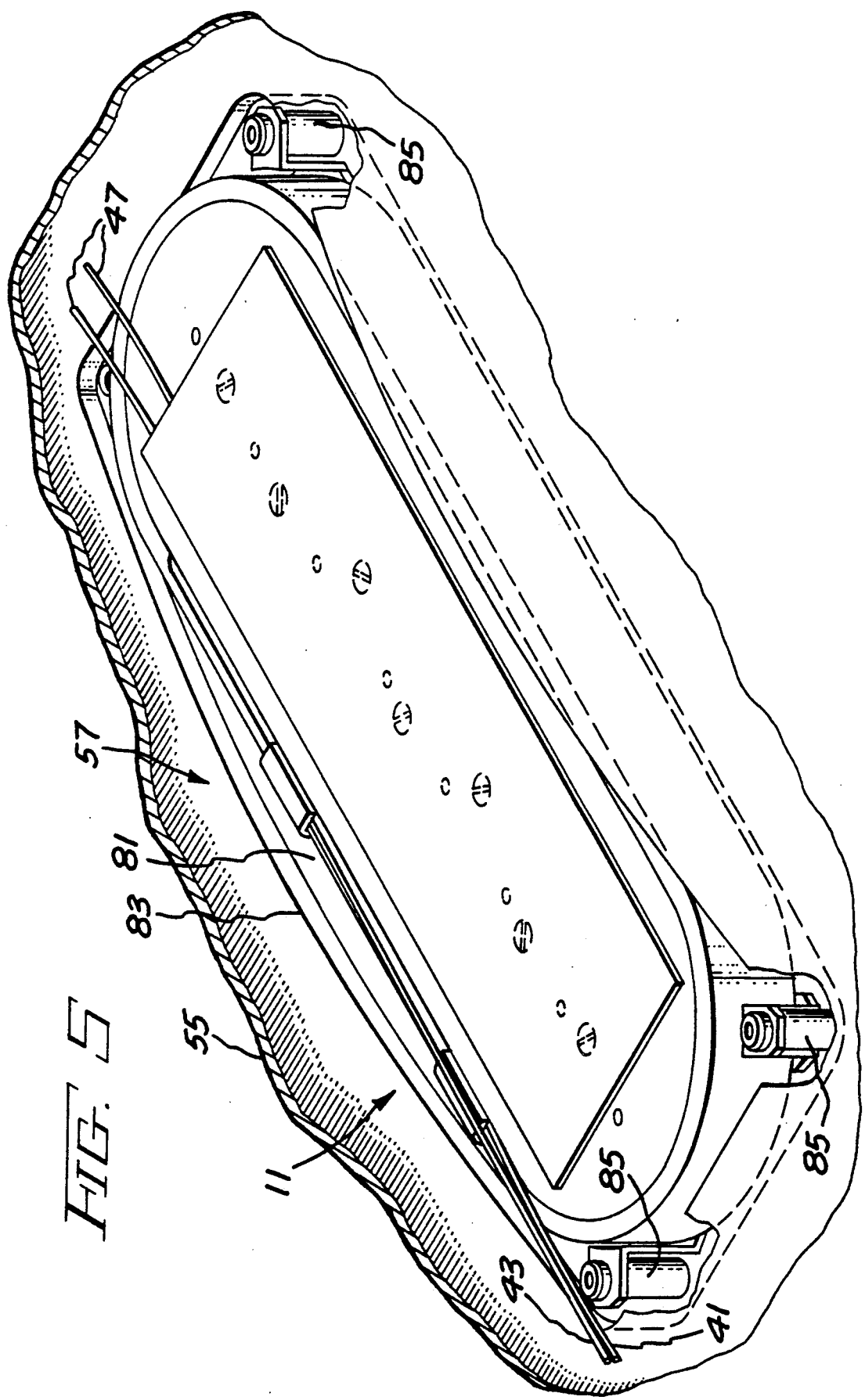

SUPERCONDUCTIVE SWITCH FOR CONDUCTION COOLED SUPERCONDUCTIVE MAGNET

BACKGROUND OF THE INVENTION

The present invention relates to persistent current, thermally controlled superconductive switches for use in high energy superconductive magnets and more particularly to superconductive switches for use in conduction cooled superconductive magnets.

Superconductive switches are used to turn superconductive magnet circuits on and off. A superconductive magnet energized in a true superconductive state has no electrical current losses provided there are no resistive components in the circuit. During the ramping of superconductive magnets, a power supply is attached to the magnet through current leads. The inability of these leads to be superconducting between the power supply, which is at room temperature, and the magnet, which is at a temperature of a few Kelvin, imposes electrical resistances within the magnet's electrical circuit and prevents the magnet from being persistent. A superconductive switch is used to bypass the resistive parts of the circuit thereby initiating a truly persistent mode of operation. The switch includes superconductive windings which are in a normal state (resistive) during current ramping of the magnet and in a superconductive state during the persistent mode of operation after ramping is completed. The switching occurs by powering a heater attached to the superconductive switch, causing the superconductor in the switch to increase in temperature beyond the transition temperature of the superconductor introducing a finite resistance to the flow of current to turn the switch "off". The persistent mode of operation is initiated by allowing the superconductive switch which is carrying current to cool below its transition temperature.

Superconductive switches are fabricated from as many turns of superconductive wire as are necessary to achieve the desired resistance in the "off" state and to provide sufficient heat capacity to the switch to avoid damage when the switch is in the normal state. In prior switches employing copper matrix superconductor, a very long wire was required to achieve even a small resistance. During ramping, when a voltage is imposed across the superconductive switch which is in the normal mode and in parallel with the superconductive winding to be energized, a high resistance is desirable since the dissipation of thermal energy in the switch is inversely proportional to the normal state electrical resistance of the switch. A low resistance switch can cause substantial energy dissipation ($V^2/R$ losses). In helium cooled superconductive magnets, the dissipated energy from the switch causes excess helium boil off. For a cryogen free conduction cooled magnet such as the one shown and claimed in U.S. Pat. No. 4,924,198, and hereby incorporated by reference, the switch's thermal energy will impose an extra load on the cryocooler and if excessive, can cause the magnet to quench.

In U.S. Pat. No. 4,904,970, a superconductive switch is shown and claimed which is wound with cupro nickel matrix niobium-titanium superconductor which has a high resistance in the normal state to reduce the amount of boil off during ramp up in a cryogen cooled superconductive magnet. Some of these high resistance switches have failed after several months of operation even though they are immersed in liquid helium during persistent mode operation.

Presently, cryogen free conduction cooled superconductive magnets are powered by a permanently connected stable power supply which provides the energy lost in the current leads to provide a constant current flow in the superconductive windings which is necessary to create a homogeneous field. Superconductive switches are not used. The conduction cooled magnet is typically cooled by a two stage cryocooler having a temperature of approximately 40K at the first stage and 10K at the second stage. The excess cooling capacity of second stage of the cryocooler which provides its cooling at 10K is limited and the cooling capacity is needed to remove conduction and radiation losses of the windings suspension.

It is an object of the present invention to provide a superconductive switch which can be used in conduction cooled superconductive magnets.

It is a further object of the present invention to provide a superconductive switch which uses tape superconductor and has a relatively high resistance when operated above the transition temperature of the superconductor.

It is a still further object of the present invention to provide a superconductive switch which does not need to be immersed in liquid cryogen during ramp up, shut down, or persistent operation when connected in parallel with a high energy magnet.

It is another object of the present invention to provide a superconductive switch which has a low thermal mass and a quick recovery time.

It is yet another object of the present invention to provide a superconductive switch which is stable in a magnetic field for long periods of time.

SUMMARY OF THE INVENTION

In one aspect of the present invention a superconductive switch for use in a superconductive magnet which is cooled by a source of conduction cooling is provided. A superconductive conductor surrounded by filler material is bifilarly wound on a bobbin. Impregnated material fills the interstices between the windings and between the windings and the bobbin. A pair of heat conductive and electrically conductive bus bars are electrically connected to a respective end of the bifilarly wound conductor and connected in a heat transfer relationship with the bobbin. The bus bars are thermally and electrically connectable to an external power supply and the superconductive conductor electrically connectable to the superconductive magnet. Switch means are provided for controllably heating the superconductive windings.

BRIEF DESCRIPTION OF THE DRAWING

The subject matter which is regarded as the invention, is particularly pointed out and distinctly claimed in the concluding portion of the specification. The invention, however, both as to organization and method of practice, together with further objects and advantages thereof, may best be understood by reference to the following description taken in conjunction with the accompanying drawing FIGURES in which:

FIG. 3 is an isometric representation of the superconductive switch mounted on a magnet cartridge of a superconductive magnet in accordance with the present invention;

FIG. 4 is a schematic wiring diagram showing the interconnection of the switch, superconductive magnet coils, and external power supply;

FIG. 5 is a partial sectional view showing the upper portion of a refrigerated superconductive magnet with a superconductive switch in accordance with the present invention.

DETAILED DESCRIPTION OF THE INVENTION

Figure 1:
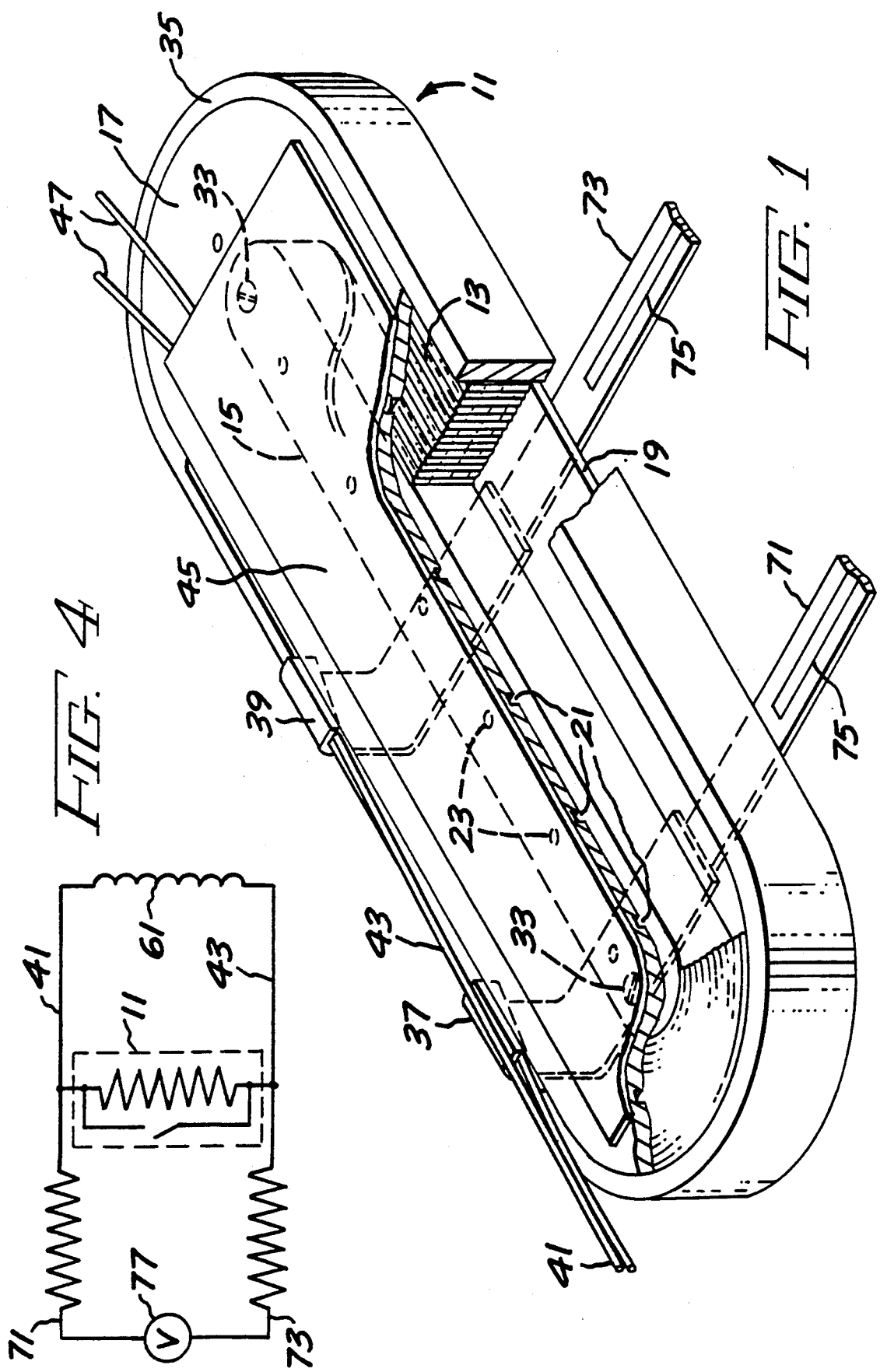
FIG. 1 is an isometric view partly in section of a superconductive switch in accordance with the present invention.

Referring now to the drawing wherein like numerals refer to like elements throughout and particularly FIG. 1 thereof, a superconductive switch 11 bifilarly wound on a coil form with niobium-tin tape conductor 13 which is laminated on both sides with stainless steel foil as is shown. The coil form comprise a bobbin of heat conductive material such as copper which can have any shape with rounded corners to avoid sharp bends in the tape, shown with a race track or elliptical shape in FIG. 1. The bobbin includes a sleeve 15 with flange plates 17 and 19 on either side also having a race track shape and aligned with one another. The conductor 13 comprises a superconductive tape such as niobium tin tape 3 mm. wide and 1 mil. thick with a current carrying capacity of 40 amp/mm at 10 Tesla field and 4.2 K temperature. Stainless steel foil of 1 mil. thickness and 3 mm. wide is laminated on both sides, such as by soldering, for structural rigidity as well as thermal stability. The lamination material does not need to be electrically conductive but is preferably symmetrically situated on either side of the tape to position the tape at the neutral axis. The lamination material does not need to be used if the tape can be wound without breaking. If an electrically conductive lamination material is used, it is selected having a sufficiently high resistance to provide a coil of a reasonable size. For some applications, copper can be used as the lamination material. For example, 250 feet of niobium tin tape with stainless steel lamination has a resistance of 5 ohms at 20 K. The size of the magnet with which the superconductive switch is to be used and the rate at which the magnet is to be ramped are the primary factors in determining the desired resistance of the switch. The higher the voltage impressed across superconductive switch during ramping, the quicker the magnet can be ramped. The use of a higher voltage requires a higher resistance to avoid excessive heat dissipation in the switch.

Figure 2:
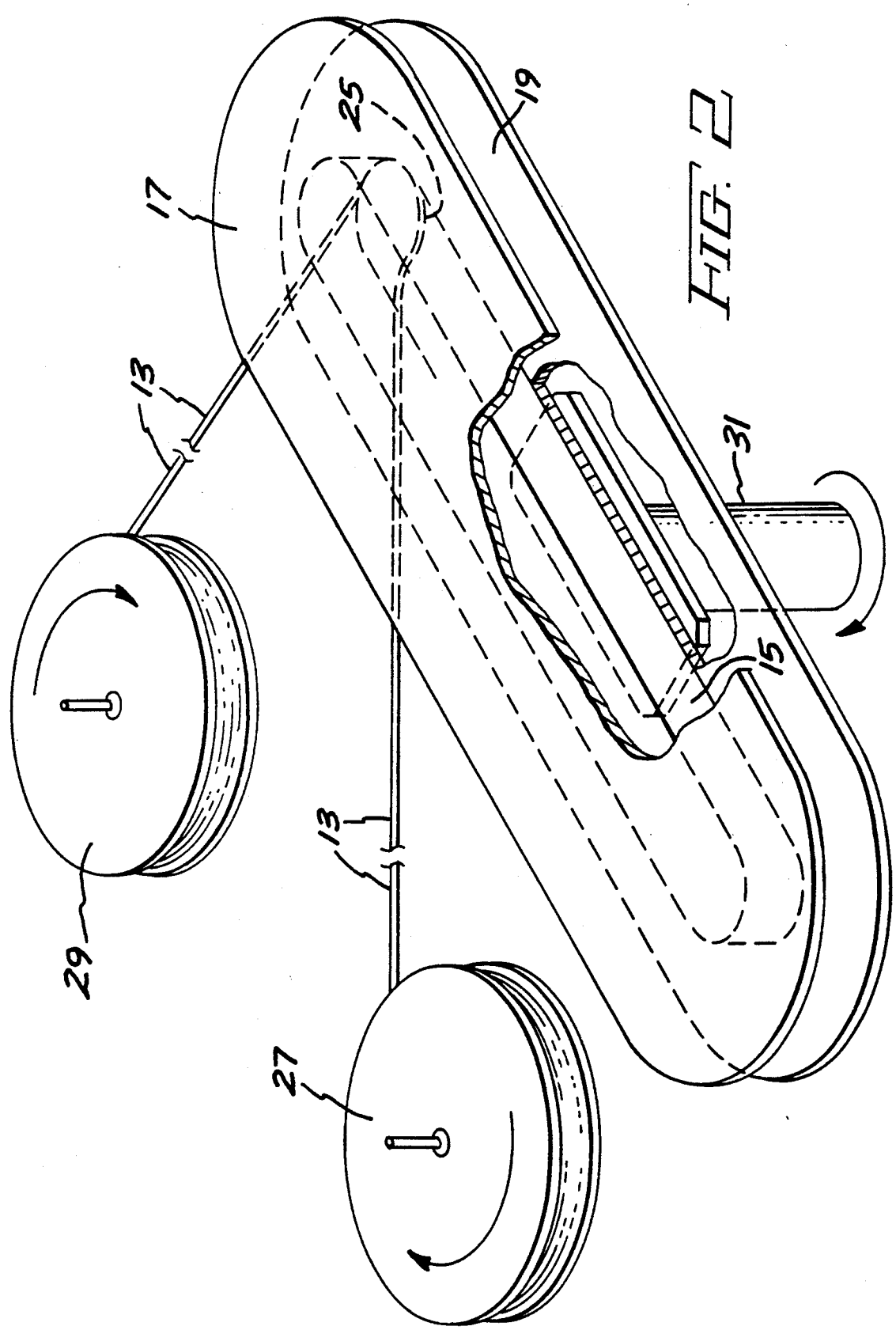
FIG. 2 is an isometric view showing the superconductive switch being bifilarly wound in accordance with the present invention.

The two flanges 17 and 19 each have channels 21 extending along their interior surfaces and holes 23 extending completely through the plates to provide good epoxy flow during impregnation. The holes and channels are not shown in the lower flange 19 for improved clarity. As shown in FIG. 2, the sleeve 15 has a machined groove 25 to allow the continuous laminated tape to be captured by end flange 19 providing the required minimum radius to avoid damaging the tape and allowing the tape to be bifilarly wound. The continuous length of tape is shown being supplied from two reels 27 and 29 as the bobbin is turned by an arbor 31 temporarily mounted on one of the flanges. The bobbin flanges 17 and 19 and sleeve 15 are oxide treated prior to winding for better epoxy bonding and fiberglass mats or paper insulation are placed on the inner surfaces of the flanges before winding to provide electrical insulation. The flanges are secured to the sleeve using machine screws 33 (shown in FIG. 1) and/or solder.

The laminated tape 13 is wrapped with woven fiberglass material or paper to provide electrical insulation between adjacent tapes and to provide a material to wick the epoxy during impregnation. The paper or woven fiberglass impregnated with epoxy also improves the heat capacity of the switch.

Referring again to FIG. 1, after the bobbin has been wound an aluminum outer housing 35 is shrunk fit around the open channel formed by the bobbin. Aluminum has a larger coefficient of expansion than copper. The last half turn or more of the superconductive tape is laminated with a thick layer of low resistance material such as 15 mils of copper foil on either side to provide stabilization of the tape when it exits from the epoxied superconductive switch. If the tape used in the switch is laminated with stainless steel foil, the foil is removed before the 15 mils of copper foil is laminated such as by soldering.

Two copper bus bars 37 and 39 electrically isolated from the switch housing but in thermal heat exchange relationship therewith, are soldered to a respective one of the two ends of the bifilarly wound tape 41 and 43, respectively where the tape emerges from the housing. The thermal contact between the bus bars 37 and 39 and the switch housing which includes the flanges 17 and 19 and the outer housing 35 can be achieved by epoxy bonding the bus bars to the flange using a fiberglass mat or paper as a filler between the bus bar and the flange 19. The switch 11 including the insulated tape, bobbin, aluminum housing and copper bus bars is vacuum pressure epoxy impregnated.

An electric heater 45 which can be of the printed foil type is secured, such as by use of adhesives, to one of the external faces of the flanges. The electric heater has leads 47 connectable to a power supply.

Referring now to FIG. 3, switch 11 is shown in a cylindrical magnet 51 suitable for use in magnetic resonance spectroscopy. The magnet comprises a cylindrical vacuum vessel 53 having an axially extending bore. Cylindrical sleeve 53a defines the bore. A thermal radiation shield 55 is situated inside the vacuum vessel and surrounds a cylindrical magnet cartridge 57 containing the superconductive windings 61 which extend circumferentially around the bore but spaced away therefrom. A two stage cryocooler 63 provides conduction cooling of the magnet with the first stage 65 thermally connected to the thermal radiation shield 55 and the second stage 67 conduction cooling the magnet cartridge 57. The copper bus bars of the switch 37 and 39 are soldered to copper bus bars 71 and 73 in the magnet which are heat stationed to the first and second stages of a cryocooler. A portion of the copper bus bars of the magnet are shown in FIG. 1. The bus bars 71 and 73 are thermally insulated from the magnet cartridge 57 by spacers 86 of thermal insulating material such as G-10 fiberglass epoxy. Heat stationing can be accomplished as described and claimed in U.S. Pat. No. 4,876,413, entitled "Efficient Thermal Joints for Connecting Current Leads to a Cryocooler" hereby incorporated by reference. To reduce the electrical resistance of the copper bus bars 71 and 73, a length of superconductive conductor 75 such as copper laminated niobium tin tape is soldered to the bus bars between the switch and the second stage of the cryocooler.

Referring now to FIG. 4 which shows a schematic circuit representation of the magnet, the copper bus bars 71 and 73 are connected to an external power supply 77. The tape leads 41 and 43 of the superconductive switch 11 are connected in series with superconductive coils 61 of the magnet.

The superconductive switch 11 is mounted in the magnet 51 within the thermal radiation shield 55 thermally insulated from its mounting surface. As shown in FIGS. 3 and 5, one location for mounting the switch is on the magnet cartridge which comprises a cylindrical fiberglass winding form 81 with machined circumferential grooves containing the superconductive windings 61. The winding form and windings are enclosed by a heat conductive aluminum or copper shell 83. The switch 11 is situated in a recess cut into the magnet cartridge 57 between grooves containing windings 61, with the switch mounted to the fiberglass form using spacers 85 of insulating material such as G-10.

In operation, the magnet 51 is cooled, so that the superconductive windings 61 are at their superconducting temperature. The superconductive switch 11 is cooled by Conduction through the copper bus bars 71 and 73. The heater 45 is powered by an external power supply to heat the switch superconductor 13 to approximately 20K when niobium tin tape is used. A temperature probe located in the switch (not shown) can be used to determine when the switch reaches 20K. When the desired temperature is reached, power to the heater is discontinued. A voltage from an external power supply 77 is provided by means of the bus bars 37 and 39 across the superconducting windings 61 and the superconductive switch 11 ramping the current that flows in both the switch and the superconducting windings 61. The external power supply 77 provides a maximum voltage initially which decreases when the rate of current ramping decreases.

The second stage of the cryocooler 67 typically has a heat removal capacity of approximately 2 watts. Approximately one watt is needed to remove heat from the superconductive windings 61 and a heat load of less than 1 watt is typically provided by the heat from the superconductive switch which flows through the bus bars to the second stage and by any resistance heating from which occurs in the bus bars themselves as current supplied by the external power supply ramps to 150 amperes. The heat from the superconductive switch includes the heat provided by the $V^2/R$ heat load from the current flowing in the switch, where V is the voltage provided by the external power supply and R is the resistance in the switch at 20K. The bus bars and heater must be sized to allow a temperature difference of approximately 10K between the superconductive switch and the second stage while the heater is operating and to allow the 10 K temperature difference to continue when the heater is disconnected and the voltage from the external power supply is imposed across the switch. Approximately 10 to 15 minutes after the current has been ramped to its desired value, and the voltage of the power supply necessary to maintain the current flow has dropped almost to zero, the superconductive switch is conduction cooled from 20K to 10K and begins to operate in the superconducting mode. The external power supply can then be removed. With the voltage of 5 volts maximum from the power supply, a 1.5 T magnet can be ramped up in about 1.5 hours. With a voltage of approximately 3 volts a 0.5 T magnet can be ramped up in approximately 0.5 hours.

The $I^2R$ losses in the copper bus bar can be reduced from approximately 0.3 watts to approximately 0.1 watts when a length of superconductive tape is connected in parallel with the bus bar between the portion of the bus bar connected between the switch and the second stage of the cryocooler such as by cooling.

To provide long term stability in the switch to avoid quenching during persistent mode of operation, the switch needs to have a high thermal conductivity to spread the heat from a disturbance at a particular point caused by a flux jump and a high specific heat to provide high heat absorption capability without a large increase in temperature. The thermal conductivity and heat capacity are provided by the epoxy impregnation of the tape which is wrapped with paper or fiberglass and enclosed in a copper bobbin and an aluminum outer housing. In addition, it has been found that niobium tin tape has improved stability at higher temperatures (above 9K) than when operating at lower temperatures such as 4.2K. This improved stability should allow long term persistent operation even though the superconductive switch is cooled by conduction and not immersed in cryogen.

The foregoing has described a superconductive switch for use in conduction cooled superconductive magnets which is stable in magnetic fields for long periods of time.

While the invention has been particularly shown and described with reference to an embodiment thereof, it will be understood by those skilled in the art that various changes in forms and detail can be made without departing from the spirit and scope of the invention.

What is claimed is:

1. A superconductive switch for use in a superconductive magnet cooled by a source of conduction cooling, comprising:
   a heat conductive bobbin;
   filler material;
   a superconductive conductor surrounded by filler material and bifilarly wound on said bobbin;
   impregnating material filling the interstices between the windings and between the windings and the bobbin;
   a pair of heat conductive and electrically conductive bus bars electrically connected to a respective end of the bifilarly wound conductor and connected in a heat transfer relationship with said bobbin, said bus bars thermally connectable to the source of conduction cooling and electrically connectable to an external power supply, said superconductive conductor electrically connectable to said superconductive magnet; and
   heater means for controllably heating said superconductive conductor.

2. The superconductive switch of claim 1 wherein said superconductive conductor comprises superconductive tape.

3. The superconductive switch of claim 2 wherein said superconductive tape comprises niobium tin tape.

4. The superconductive switch of claim 2 wherein said superconductive tape is laminated with a stabilizer on both sides.

5. The superconductive switch of claim 4 wherein said tape is laminated with stainless steel foil.

6. The superconductive switch of claim 4 wherein said tape is laminated with copper foil.

7. The superconductive switch of claim 1 wherein said bobbin is fabricated from copper.

8. The superconductive switch of claim 7 further comprising an aluminum housing shrunk fit around the circumference of said bobbin.

9. The superconductive switch of claim 1 further comprises a superconductive conductor electrically connected along at least a part of the length of each of said bus bars.

10. A superconductive magnet comprising:
   a magnet cartridge having at least one superconductive coil;
   a vacuum vessel;
   a thermal radiation shield situated inside said vacuum vessel and enclosing said superconductive coil;
   conduction cooling means for providing cooling at a first and a second temperature, said second temperature being lower than the fist temperature, said thermal radiation shield conduction cooled by said conduction cooling means at the first temperature and said superconductive winding conduction cooled by said conduction cooling means at the second temperature; and
   a superconductive switch situated in said vacuum vessel, said switch comprising a heat conductive bobbin; filler material; a superconductive conductor surrounded by said filler material and bifilarly wound on said bobbin; impregnating material filling the interstices between the windings and between the windings and the bobbin; a pair of heat conductive and electrically conductive bus bars electrically connected to a respective end of the bifilarly wound conductor and connected in a heat transfer relationship with said bobbin, said bus bars thermally connected to said conduction cooling means at the second temperature and electrically connectable to an external power supply, said superconductive conductor electrically connected to said superconductive coil; and heater means for controllably heating said superconductive conductor in said switch.

11. The superconductive magnet of claim 10 wherein said superconductive switch is mounted on said magnet cartridge and thermally insulated therefrom.

12. The superconductive magnet of claim 10 wherein said conduction cooling means comprises a two stage crycooler providing cooling at two temperatures, one at each stage, the second stage operable at a lower temperature than the first stage.

13. The superconductive switch of claim 10 wherein said superconductive conductor comprises superconductive tape.

14. The superconductive switch of claim 13 wherein said superconductive tape comprises niobium tin tape.

15. The superconductive switch of claim 13 wherein said superconductive tape is laminated with a stabilizer on both sides.

16. The superconductive switch of claim 15 wherein said tape is laminated with stainless steel foil.

17. The superconductive switch of claim 15 wherein said tape is laminated with copper foil.

18. The superconductive switch of claim 10 wherein said bobbin is fabricated from copper.

19. The superconductive switch of claim 18 further comprising an aluminum housing shrunk fit around the circumference of said bobbin.

20. The superconductive switch of claim 10 further comprises a superconductive conductor electrically connected along at least a part of the length of each of said bus bars.

* * * * *